(12) United States Patent
Ikeya et al.

(10) Patent No.: US 9,299,860 B2
(45) Date of Patent: Mar. 29, 2016

(54) SOLID STATE IMAGING DEVICE INCLUDING PHOTOELECTRIC CONVERSION PORTION

(75) Inventors: Tomohiro Ikeya, Hamamatsu (JP); Yasuhito Yoneta, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 172 days.

(21) Appl. No.: 13/977,976

(22) PCT Filed: Nov. 11, 2011

(86) PCT No.: PCT/JP2011/076112
§ 371 (c)(1),
(2), (4) Date: Jul. 2, 2013

(87) PCT Pub. No.: WO2012/096052
PCT Pub. Date: Jul. 19, 2012

(65) Prior Publication Data
US 2013/0285188 A1    Oct. 31, 2013

(30) Foreign Application Priority Data

Jan. 14, 2011 (JP) ................. 2011-005891

(51) Int. Cl.
*H01L 31/00*    (2006.01)
*H01L 31/02*    (2006.01)
*H01L 27/148*    (2006.01)

(52) U.S. Cl.
CPC .......... *H01L 31/02* (2013.01); *H01L 27/14806* (2013.01); *H01L 27/14831* (2013.01)

(58) Field of Classification Search
CPC ................ H01L 27/14831; H01L 27/14887; H01L 27/14603; H01L 27/14643; H01L 27/14843; H01L 27/14812
See application file for complete search history.

(56) References Cited

U.S. PATENT DOCUMENTS

| 8,514,312 B2* | 8/2013 | Matsuda ................ 348/316 |
| 2002/0195543 A1 | 12/2002 | Oda |
| 2010/0321552 A1 | 12/2010 | Matsuda |
| 2014/0367554 A1* | 12/2014 | Kuboi ................ 250/208.1 |

FOREIGN PATENT DOCUMENTS

| CN | 101542734 | 9/2009 |
| JP | 4-180479 A | 6/1992 |

(Continued)

*Primary Examiner* — Tony Ko
(74) *Attorney, Agent, or Firm* — Drinker Biddle & Reath LLP

(57) ABSTRACT

A solid state imaging device 1 is provided with a photoelectric conversion portion 2 having photosensitive regions 13, and a potential gradient forming portion 3 arranged opposite to the photosensitive regions 13. A planar shape of each photosensitive region 13 is a substantially rectangular shape composed of two long sides and two short sides. The photosensitive regions 13 are juxtaposed in a first direction intersecting with the long sides. The potential gradient forming portion 3 has a first potential gradient forming region to form a potential gradient becoming lower along a second direction from one of the short sides to the other of the short sides, and a second potential gradient forming region to form a potential gradient becoming higher along the second direction. The second potential gradient forming region is arranged next to the first potential gradient forming region in the second direction.

8 Claims, 9 Drawing Sheets

(56) References Cited

FOREIGN PATENT DOCUMENTS

| JP | 6-283704 A | 10/1994 |
| JP | 2000-58810 A | 2/2000 |
| JP | 2003-8996 A | 1/2003 |
| JP | 2011-009274 | 1/2011 |
| WO | WO-2008/066067 A1 | 6/2008 |
| WO | WO-2009/133799 A1 | 11/2009 |

* cited by examiner (a)

(b)

(c)

(a)

(b)

(c)

SOLID STATE IMAGING DEVICE INCLUDING PHOTOELECTRIC CONVERSION PORTION

TECHNICAL FIELD

The present invention relates to a solid state imaging device.

BACKGROUND ART

There is a known solid state imaging device provided with a photoelectric conversion portion having a plurality of photosensitive regions, a charge output portion to acquire charges transferred from the respective photosensitive regions and to transfer and output them, and a charge drain portion to drain charges transferred from the respective photosensitive regions (e.g., cf. Patent Literature 1). In the solid state imaging device described in Patent Literature 1, each photosensitive region has a nearly rectangular shape. The charge output portion is arranged beside one side of the photosensitive region. The charge drain portion is arranged beside another side of the photosensitive region adjacent to the foregoing one side.

CITATION LIST

Patent Literature

Patent Literature 1: Japanese Patent Application Laid-open No. Hei6-283704

SUMMARY OF INVENTION

Technical Problem

In the meantime, there are recent demands for a solid state imaging device capable of detecting weak light. For enabling detection of weak light, it is effective to enlarge each photosensitive region to increase an amount of charge generated according to incidence of light (or to enhance sensitivity to incident light) and to set a charge accumulation period longer. In general, the accumulation of charge is started after execution of drain of unnecessary charge. Therefore, in order to allow the charge accumulation period to be set longer within a fixed accumulation duration, it is necessary to shorten a period for the drain of charge.

The solid state imaging device described in Patent Literature 1 has the following problem about the charge accumulation period. If the photosensitive region is enlarged by lengthening the edge on the side where the charge output portion is arranged, a charge transfer distance will become longer in the photosensitive region during the drain of charge. For this reason, it is infeasible to shorten the period for the drain of charge. If the photosensitive region is enlarged by lengthening the edge on the side where the charge drain portion is arranged, while the charge drain portion is enlarged according to the photosensitive region, the charge transfer distance can be kept short in the photosensitive region during the charge drain. However, an electric response of the charge drain portion will become slower, so as to lengthen a period before a start of the charge drain, thus failing to shorten the period for the drain of charge. For these reasons, the enlargement of the photosensitive region does not allow the charge accumulation period to be set longer.

Therefore, an object of the present invention is to provide a solid state imaging device having high sensitivity to incident light and allowing the charge accumulation period to be set longer.

Solution to Problem

The present invention provides a solid state imaging device comprising: a photoelectric conversion portion having a plurality of photosensitive regions which generate respective charges according to incidence of light and a planar shape of each of which is a substantially rectangular shape composed of two long sides and two short sides, the photosensitive regions being juxtaposed in a first direction intersecting with the long sides; a potential gradient forming portion which is arranged opposite to the plurality of photosensitive regions and which forms a potential gradient along a second direction from one of the short sides to the other of the short sides; a first charge output portion which is arranged beside the one short side and which transfers charges transferred from the respective photosensitive regions, in the first direction and outputs the charges; a second charge output portion which is arranged beside the other short side and which transfers charges transferred from the respective photosensitive regions, in the first direction and outputs the charges; a first charge drain portion which is arranged beside the one short side and which drains charges transferred from the respective photosensitive regions; and a second charge drain portion which is arranged beside the other short side and which drains charges transferred from the respective photosensitive regions, wherein the potential gradient forming portion has a first potential gradient forming region to form a potential gradient becoming lower along the second direction, and a second potential gradient forming region to form a potential gradient becoming higher along the second direction, the second potential gradient forming region being arranged next to the first potential gradient forming region in the second direction.

In the solid state imaging device according to the present invention, each photosensitive region has a relatively wide area because the planar shape thereof is the shape extending along the long sides. This enhances the sensitivity to incident light into the photosensitive regions.

In the present invention, the potential gradient forming portion has the first potential gradient forming region and the second potential gradient forming region. Charges generated in regions corresponding to the first potential gradient forming region in the photosensitive regions are transferred to the aforementioned one short side by the potential gradient formed by the first potential gradient forming region. The charges transferred to the one short side of the photosensitive regions are drained as unnecessary charges by the first charge drain portion. Charges generated in regions corresponding to the second potential gradient forming region in the photosensitive regions are transferred from the aforementioned other short side by the potential gradient formed by the second potential gradient forming region. The charges transferred to the other short side of the photosensitive regions are drained as unnecessary charges by the second charge drain portion. Since the charges generated in the photosensitive regions are transferred respectively to the one short side and to the other short side in this manner, the period for the drain of the charges generated in the photosensitive regions as unnecessary charges is short. Therefore, it is feasible to set the charge accumulation period longer.

The first charge drain portion and the second charge drain portion may be arranged corresponding to each one of the photosensitive regions. In this case, the period for the drain of the charges from the respective photosensitive regions becomes shorter.

The first charge drain portion and the second charge drain portion may be arranged corresponding to each set of two photosensitive regions adjacent in the first direction. In this case, the numbers of first charge drain portions and second charge drain portions are reduced, which allows each of the first charge drain portions and second charge drain portions to be formed in a larger area. Therefore, the first charge drain portions and the second charge drain portions can be readily formed.

Furthermore, the first charge drain portions and the second charge drain portions may be alternated along the first direction. In each of the first charge drain portions and the second charge drain portions, there are cases where a drain speed of a charge transferred from one side of the corresponding two photosensitive regions is different from that of a charge transferred from the other side. Even in such cases, each photosensitive region transfers the charge from the aforementioned one side to one of the first charge drain portion and the second charge drain portion, and from the aforementioned other side to the other of the first charge drain portion and the second charge drain portion. For this reason, the difference of charge drain periods in each photosensitive region is reduced.

The device may further comprise an adding portion which adds the charge output from the second charge output portion to the charge output from the first charge output portion. In this case, there is no need for an addition process outside the solid state imaging device.

The device may be configured as follows: it further comprises a first charge accumulation portion which is arranged beside the one short side and which accumulates charges transferred from the respective photosensitive regions; and a second charge accumulation portion which is arranged beside the other short side and which accumulates charges transferred from the respective photosensitive regions; the first charge output portion transfers charges transferred from the first charge accumulation portion, in the first direction and outputs the charges, and the first charge drain portion drains charges transferred from the first charge accumulation portion; the second charge output portion transfers charges transferred from the second charge accumulation portion, in the first direction and outputs the charges, and the second charge drain portion drains charges transferred from the second charge accumulation portion. In this case, the first charge output portion, the second charge output portion, the first charge drain portion, and the second charge drain portion do not have to be located next to the photosensitive regions, providing higher degrees of freedom for arrangement of each portion.

The potential gradient forming portion may have an electroconductive member arranged opposite to the plurality of photosensitive regions, a pair of electrodes connected to two end areas in the second direction of the electroconductive member, and an electrode connected to the electroconductive member between the two end areas. In this case, the potential gradient is formed by the simple configuration of the electroconductive member and the electrodes.

The solid state imaging device may be a back illuminated type.

Advantageous Effect of Invention

The present invention can provide the solid state imaging device having high sensitivity to incident light and allowing the charge accumulation period to be set longer.

DESCRIPTION OF EMBODIMENTS

The preferred embodiments of the present invention will be described below in detail with reference to the accompanying drawings. In the description, identical elements or elements with identical functionality will be denoted by the same reference signs, without redundant description.

Figure 1:
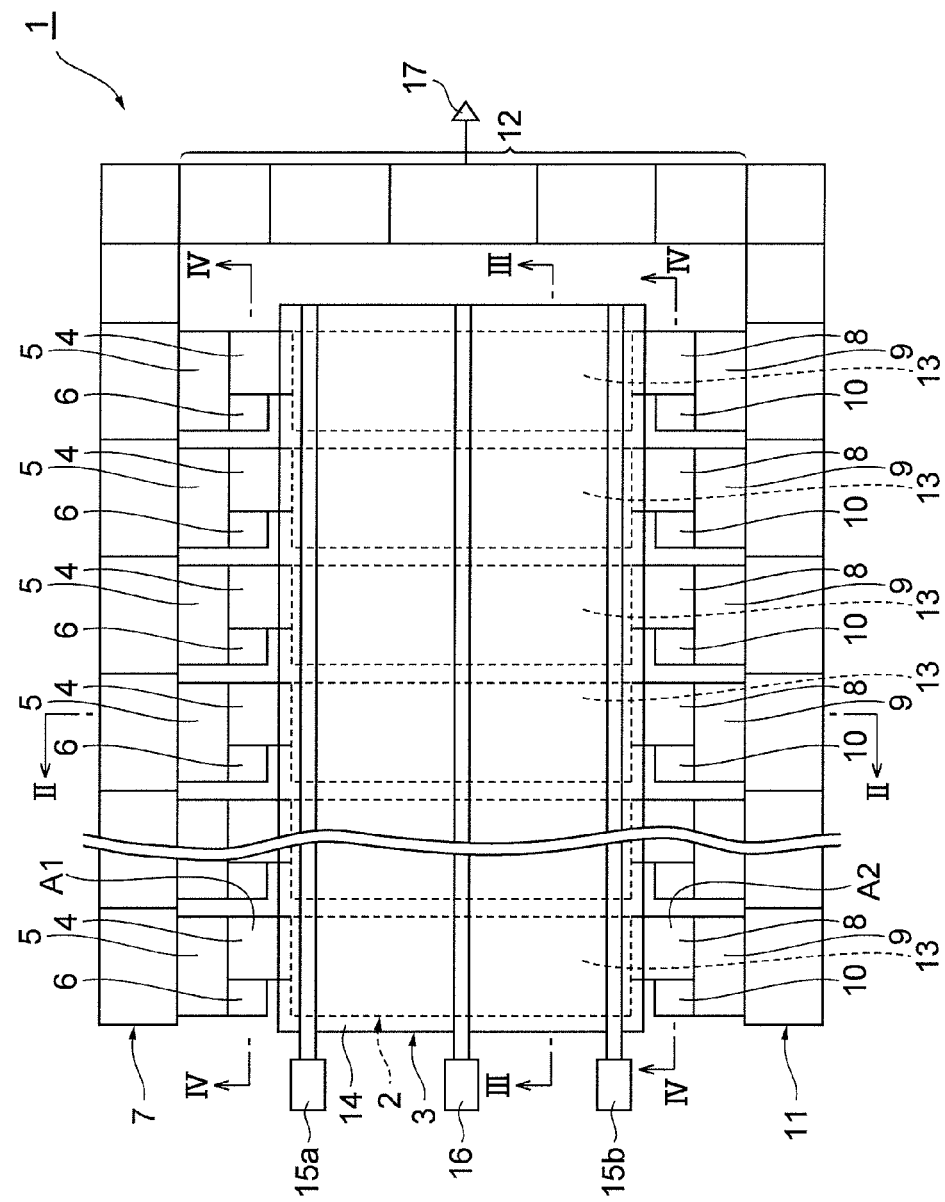
FIG. 1 is a plan view showing a configuration of a solid state imaging device according to an embodiment of the present invention.
Figure 2:
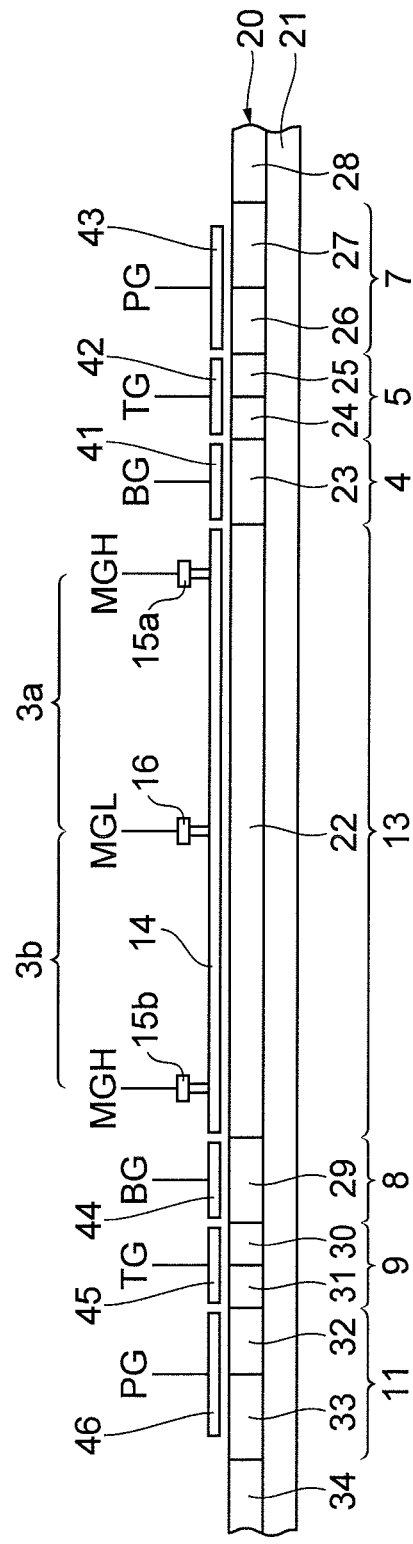
FIG. 2 is a drawing for explaining a sectional configuration along the line II-II in FIG. 1.
Figure 3:
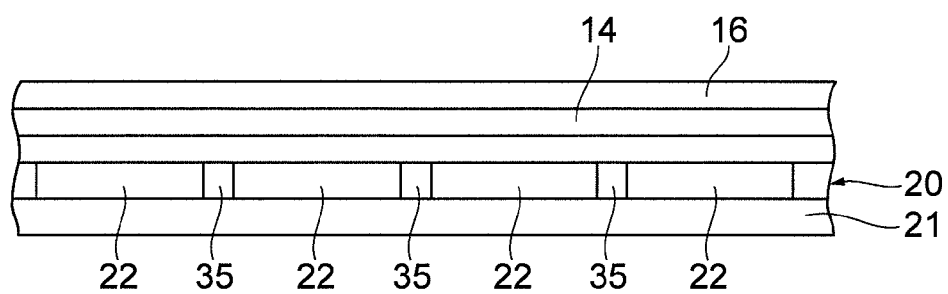
FIG. 3 is a drawing for explaining a sectional configuration along the line III-III in FIG. 1.
Figure 4:
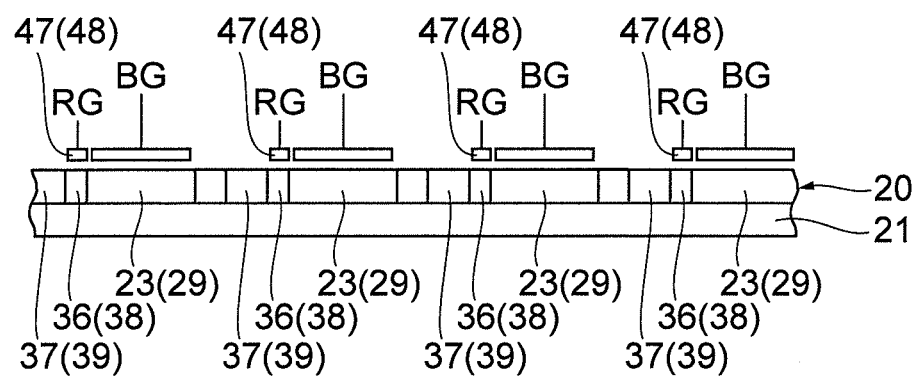
FIG. 4 is a drawing for explaining a sectional configuration along the line IV-IV in FIG. 1.

FIG. 1 is a plan view showing a configuration of a solid state imaging device according to an embodiment of the present invention. FIG. 2 is a drawing for explaining a sectional configuration along the line II-II in FIG. 1. FIG. 3 is a drawing for explaining a sectional configuration along the line III-III in FIG. 1. FIG. 4 is a drawing for explaining a sectional configuration along the line IV-IV in FIG. 1.

The solid state imaging device 1 according to the present embodiment is provided with a photoelectric conversion portion 2, a potential gradient forming portion 3, a plurality of first charge accumulation portions 4, a plurality of first charge transfer portions 5, a plurality of first charge drain portions 6, a first shift register 7 as a first charge output portion, a plurality of second charge accumulation portions 8, a plurality of second charge transfer portions 9, a plurality of second charge drain portions 10, a second shift register 11 as a second charge output portion, and an adding portion 12. The solid state imaging device 1 can be used, for example, as a photodetection means of a spectroscope.

The photoelectric conversion portion 2 has a plurality of photosensitive regions 13 to generate respective charges according to incidence of light. A planar shape of each photosensitive region 13 is a nearly rectangular shape composed of two long sides and two short sides. The plurality of photosensitive regions 13 are juxtaposed in a first direction intersecting with the long sides (which is a one-dimensional direction along the short sides herein). An isolation region (not shown) is arranged between each set of adjacent photosensitive regions 13 to electrically separate the photosensitive regions 13 from each other. In the present embodiment the first direction is perpendicular to the long sides.

The potential gradient forming portion 3 has an electroconductive member 14, a pair of electrodes 15a, 15b, and an electrode 16. The potential gradient forming portion 3 forms a potential gradient along a second direction from one of the short sides to the other of the short sides of each photosensitive region 13. The electroconductive member 14 is arranged so as to face each photosensitive region 13. The potential electrodes 15a, 15b are arranged respectively at the two end areas in the second direction of the electroconductive member 14. The electrode 15a is arranged at the end area beside the aforementioned one short side and the electrode 15b at the end area beside the aforementioned other short side. The electrodes 15a, 15b are arranged respectively inside the two ends in the second direction of the electroconductive member 14. The electrodes 15a, 15b may be arranged respectively at the two ends in the second direction of the electroconductive member 14. The electrode 16 is arranged at an approximately intermediate position between the electrodes 15a, 15b.

Each one of the first charge accumulation portions 4 is arranged per photosensitive region 13, beside the one short side. Each first charge accumulation portion 4 is adjacent in the second direction to the corresponding photosensitive region 13. Namely, the plurality of first charge accumulation portions 4 are juxtaposed in the first direction beside the one short side. An isolation region (not shown) is arranged between each set of adjacent first charge accumulation portions 4 to electrically separate the first charge accumulation portions 4 from each other. Each first charge accumulation portion 4 accumulates a charge transferred from the corresponding photosensitive region 13. Each first charge accumulation portion 4 transfers the charge to the first charge transfer portion 5. Each first charge accumulation portion 4 transfers the charge to the first charge drain portion 6.

Each one of the first charge transfer portions 5 is arranged per first charge accumulation portion 4. Each first charge transfer portion 5 is adjacent in the second direction to the corresponding first charge accumulation portion 4. Namely, the plurality of first charge transfer portions 5 are juxtaposed in the first direction beside the one short side. An isolation region (not shown) is arranged between each set of adjacent first charge transfer portions 5 to electrically separate the first charge transfer portions 5 from each other. Each first charge transfer portion 5 acquires the charge transferred from the corresponding first charge accumulation portion 4 and transfers the charge to the first shift register 7.

Each one of the first charge drain portions 6 is arranged per first charge accumulation portion 4. Namely, the plurality of first charge drain portions 6 are arranged corresponding to the respective photosensitive regions 13. Each first charge drain portion 6 is adjacent in the first direction to the corresponding first charge accumulation portion 4. Each first charge drain portion 6 is arranged in juxtaposition to the first charge accumulation portion 4 as they are alternated along the first direction beside the one short side. Each first charge drain portion 6 drains the charge transferred from the corresponding first charge accumulation portion 4.

The first shift register 7 is adjacent in the second direction to each of the first charge transfer portions 5. Namely, the first shift register 7 is arranged beside the one short side. The first shift register 7 acquires each of charges transferred from the respective first charge transfer portions 5 and transfers the charges in the first direction to sequentially output them to the adding portion 12.

Each one of the second charge accumulation portions 8 is arranged per photosensitive region 13, beside the aforementioned other short side. Each second charge accumulation portion 8 is adjacent in the second direction to the corresponding photosensitive region 13. Namely, the plurality of second charge accumulation portions 8 are juxtaposed in the first direction beside the other short side. An isolation region (not shown) is arranged between each set of adjacent second charge accumulation portions 8 to electrically separate the second charge accumulation portions 8 from each other. Each second charge accumulation portion 8 accumulates a charge transferred from the corresponding photosensitive region 13. Each second charge accumulation portion 8 transfers the charge to the second charge transfer portion 9. Each second charge accumulation portion 8 transfers the charge to the second charge drain portion 10.

Each one of the second charge transfer portions 9 is arranged per second charge accumulation portion 8. Each second charge transfer portion 9 is adjacent in the second direction to the corresponding second charge accumulation portion 8. Namely, the plurality of second charge transfer portions 9 are juxtaposed in the first direction beside the other short side. An isolation region (not shown) is arranged between each set of adjacent second charge transfer portions 9 to electrically separate the second charge transfer portions 9 from each other. Each second charge transfer portion 9 acquires the charge transferred from the corresponding second charge accumulation portion 8 and transfers the charge to the second shift register 11.

Each one of the second charge drain portions 10 is arranged per second charge accumulation portion 8. Namely, the plurality of second charge drain portions 10 are arranged corresponding to the respective photosensitive regions 13. Each second charge drain portion 10 is adjacent in the first direction to the corresponding second charge accumulation portion 8. Each second charge drain portion 10 is arranged in juxtaposition to the second charge accumulation portion 8 as they are alternated along the first direction beside the other short side. Each second charge drain portion 10 drains the charge transferred from the corresponding second charge accumulation portion 8.

The second shift register 11 is adjacent in the second direction to each of the second charge transfer portions 9. Namely, the second shift register 11 is arranged beside the other short side. The second shift register 11 acquires each of charges transferred from the respective second charge transfer portions 9 and transfers the charges in the first direction to sequentially output them to the adding portion 12.

The adding portion 12 adds the charge output from the second shift register 11 to the charge output from the first shift register 7, and outputs the resulting charge. The charge output from the adding portion 12 is converted into a voltage by an amplifier portion 17 to be output to the outside of the solid state imaging device 1.

The photoelectric conversion portion 2, potential gradient forming portion 3, first charge accumulation portions 4, first charge transfer portions 5, first charge drain portions 6, first shift register 7, second charge accumulation portions 8, second charge transfer portions 9, second charge drain portions 10, and second shift register 11 are formed on a semiconductor substrate 20 as shown in FIGS. 2 to 4. The semiconductor substrate 20 includes a p-type semiconductor layer 21 as a base, a plurality of n-type semiconductor layers 22, 23, 25, 27, 29, 31, 33, a plurality of n$^-$-type semiconductor layers 24, 26, 30, 32, and p$^+$-type semiconductor layers 28, 34 formed on one side of the p-type semiconductor layer 21. As shown in FIG. 3, the semiconductor substrate 20 includes p$^+$-type semiconductor layers 35 formed on the one side of the p-type semiconductor layer 21. As shown in FIG. 4, the semiconductor substrate 20 includes n$^-$-type semiconductor layers 36, 38 and n$^+$-type semiconductor layers 37, 39 formed on the one side of the p-type semiconductor layer 21.

In the present embodiment, Si is used as a material of the substrate. "High impurity concentration" refers to an impurity concentration of not less than about $1 \times 10^{17}$ cm$^{-3}$, for example. "+" is attached to conductivity type to indicate "high impurity concentration." "Low impurity concentration" refers to an impurity concentration of not more than about $1\times10^{15}$ cm$^{-3}$, for example. "−" is attached to conductivity type to indicate "low impurity concentration." Examples of n-type impurities include arsenic, phosphorus, and so on and examples of p-type impurities include boron and others.

As shown in FIG. 2, each n-type semiconductor layer 22 forms a pn junction with the p-type semiconductor layer 21 and each n-type semiconductor layer 22 constitutes a photosensitive region 13. The solid state imaging device 1 is a solid state imaging device of a back illuminated type, in which light is incident from the p-type semiconductor layer 21 side. A planar shape of each n-type semiconductor layer 22 is a nearly rectangular shape composed of two long sides and two short sides, and the planar shape corresponds to the planar shape of each photosensitive region 13. The plurality of n-type semiconductor layers 22 are juxtaposed in the first direction. Each of the p$^+$-type semiconductor layers 35 is arranged between adjacent n-type semiconductor layers 22 and this p$^+$-type semiconductor layer 35 constitutes an isolation region between photosensitive regions 13 (cf. FIG. 3).

The electroconductive member 14 is arranged above each of the n-type semiconductor layers 22. The electroconductive member 14 is formed on each n-type semiconductor layer 22 through an insulating layer (not shown). The electrodes 15a, 15b are connected respectively to the two end areas in the second direction of the electroconductive member 14. The electrode 16 is connected to the electroconductive member 14 at the approximately intermediate position between the electrodes 15a, 15b. The electroconductive member 14 and the electrodes 15a, 15b, 16 extend in the first direction and are formed across each n-type semiconductor layer 22 (cf. FIG. 1). In the present embodiment, polysilicon or the like can be used as a material of the electroconductive member 14 and aluminum or the like can be used as a material of the electrodes 15a, 15b, 16.

The electroconductive member 14 constitutes a so-called resistive gate. The electrodes 15a, 15b are given a signal MGH from a control circuit (not shown) and the electrode 16 a signal MGL from the control circuit (not shown). When the signal MGL and the signal MGH are at L-level, no potential gradient is formed in the electroconductive member 14. A voltage applied at H-level of the signal MGL and a voltage applied at H-level of the signal MGH are different. The voltage applied at H-level of the signal MGH is higher than the voltage applied at H-level of the signal MGL. For this reason, when the signal MGL and the signal MGH are at H-level, a potential gradient becoming lower from the electrode 15a to the electrode 16 (along the second direction) is formed in the electroconductive member 14 and a potential gradient becoming higher from the electrode 16 to the electrode 15b (along the second direction) is formed in the electroconductive member 14. Therefore, the potential gradient forming portion 3, as shown in FIG. 2, has a first potential gradient forming region 3a to form the potential gradient becoming lower along the second direction, and a second potential gradient forming region 3b to form the potential gradient becoming higher along the second direction. The second potential gradient forming region 3b is arranged next to the first potential gradient forming region 3a in the second direction.

Each one of the n-type semiconductor layers 23 is arranged per n-type semiconductor layer 22, beside the aforementioned one short side. Each n-type semiconductor layer 23 is adjacent in the second direction to the corresponding n-type semiconductor layer 22. Namely, the plurality of n-type semiconductor layers 23 are juxtaposed in the first direction beside the one short side. Each n-type semiconductor layer 23 constitutes a first charge accumulation portion 4. A planar shape of each n-type semiconductor layer 23 is a nearly rectangular shape composed of two sides along the second direction and two sides intersecting with the second direction. One side of each n-type semiconductor layer 23 intersecting with the second direction is in contact with the one short side of the corresponding n-type semiconductor layer 22. The first charge accumulation portion 4 has a first charge accumulation region A1 of a nearly rectangular shape composed of two sides along the second direction and two sides intersecting with the second direction, corresponding to the planar shape of n-type semiconductor layer 23. As in the case of the n-type semiconductor layers 22, each one of the p$^+$-type semiconductor layers 35 is arranged between a set of adjacent n-type semiconductor layers 23 to constitute an isolation region between the first charge accumulation portions 4.

An electrode 41 is arranged above each n-type semiconductor layer 23. The electrode 41 is formed on each n-type semiconductor layer 23 through an insulating layer (not shown). The electrode 41 extends in the first direction and is formed across each n-type semiconductor layer 23. The electrode 41 may be formed per the n-type semiconductor layer 23. The electrode 41 is given a signal BG from the control circuit (not shown) to drive the first charge accumulation portions 4.

Each one of the n$^-$-type semiconductor layers 24 is arranged per n-type semiconductor layer 23. Each n$^-$-type semiconductor layer 24 is adjacent in the second direction to the corresponding n-type semiconductor layer 23. Namely, the plurality of n$^-$-type semiconductor layers 24 are juxtaposed in the first direction beside the one short side. Each one of the n-type semiconductor layers 25 is arranged per n$^-$-type semiconductor layer 24. Each n-type semiconductor layer 25 is adjacent in the second direction to the corresponding n$^-$-type semiconductor layer 24. Namely, the plurality of n-type semiconductor layers 25 are juxtaposed in the first direction beside the one short side. Each pair of n$^-$-type semiconductor layer 24 and n-type semiconductor layer 25 constitutes a first charge transfer portion 5. Each n$^-$-type semiconductor layer 24 is arranged so as to contact one side intersecting with the second direction out of the sides of the corresponding n-type semiconductor layer 23. Each first charge transfer portion 5 is arranged beside one side intersecting with the second direction out of the sides of the corresponding first charge accumulation region A1. As in the case of the n-type semiconductor layers 22, each one of the p$^+$-type semiconductor layers 35 is arranged between a set of adjacent n$^-$-type semiconductor layers 24 and between a set of adjacent n-type semiconductor layers 25 to form an isolation region between the first charge transfer portions 5.

An electrode 42 is arranged above each n$^-$-type semiconductor layer 24 and each n-type semiconductor layer 25. The electrode 42 is formed on each n$^-$-type semiconductor layer 24 and each n-type semiconductor layer 25 through an insulating layer (not shown). The electrode 42 extends in the first direction and is formed across each n$^-$-type semiconductor layer 24 and each n-type semiconductor layer 25. The electrode 42 may be formed per the n$^-$-type semiconductor layer 24 and per the n-type semiconductor layer 25. The electrode 42 is given a signal TG to drive the first charge transfer portions 5.

Each one of the n$^-$-type semiconductor layers 26 is arranged per n-type semiconductor layer 25. Each n$^-$-type semiconductor layer 26 is adjacent in the second direction to the corresponding n-type semiconductor layer 25. Namely, the plurality of n$^-$-type semiconductor layers 26 are juxtaposed in the first direction beside the one short side. Each one of the n-type semiconductor layers 27 is arranged per n⁻-type semiconductor layer 26. Each n-type semiconductor layer 27 is adjacent in the second direction to the corresponding n⁻-type semiconductor layer 26. Namely, the plurality of n-type semiconductor layers 27 are juxtaposed in the first direction beside the one short side. The adjacent n⁻-type semiconductor layers 26 and adjacent n-type semiconductor layers 27 are in contact with each other. The plurality of n⁻-type semiconductor layers 26 and the plurality of n-type semiconductor layers 27 constitute the first shift register 7.

An electrode 43 is arranged above each pair of n⁻-type semiconductor layer 26 and n-type semiconductor layer 27. The electrode 43 is formed on each pair of n⁻-type semiconductor layer 26 and n-type semiconductor layer 27 through an insulating layer (not shown). The electrode 43 is formed per pair of n⁻-type semiconductor layer 26 and n-type semiconductor layer 27. The electrodes 43 are given a signal PG to drive the first shift register 7.

Each one of the n-type semiconductor layers 29 is arranged per n-type semiconductor layer 22, beside the aforementioned other short side. Each n-type semiconductor layer 29 is adjacent in the second direction to the corresponding n-type semiconductor layer 22. Namely, the plurality of n-type semiconductor layers 29 are juxtaposed in the first direction beside the other short side. Each n-type semiconductor layer 29 constitutes a second charge accumulation portion 8. A planar shape of each n-type semiconductor layer 29 is a nearly rectangular shape composed of two sides along the second direction and two sides intersecting with the second direction. One side of each n-type semiconductor layer 29 intersecting with the second direction is in contact with the other short side of the corresponding n-type semiconductor layer 22. The second charge accumulation portion 8 has a second charge accumulation region A2 of a nearly rectangular shape composed of two sides along the second direction and two sides intersecting with the second direction, corresponding to the planar shape of the n-type semiconductor layer 29. As in the case of the n-type semiconductor layers 22, each one of the p⁺-type semiconductor layers 35 is arranged between a set of adjacent n-type semiconductor layers 29 to constitute an isolation region between the second charge accumulation portions 8.

An electrode 44 is arranged above each n-type semiconductor layer 29. The electrode 44 is formed on each n-type semiconductor layer 29 through an insulating layer (not shown). The electrode 44 extends in the first direction and is formed across each n-type semiconductor layer 29. The electrode 44 may be formed per the n-type semiconductor layer 29. The electrode 44 is given a signal BG from the control circuit (not shown) to drive the second charge accumulation portions 8.

Each one of the n⁻-type semiconductor layers 30 is arranged per n-type semiconductor layer 29. Each n⁻-type semiconductor layer 30 is adjacent in the second direction to the corresponding n-type semiconductor layer 29. Namely, the plurality of n⁻-type semiconductor layers 30 are juxtaposed in the first direction beside the other short side. Each one of the n-type semiconductor layers 31 is arranged per n⁻-type semiconductor layer 30. Each n-type semiconductor layer 31 is adjacent in the second direction to the corresponding n⁻-type semiconductor layer 30. Namely, the plurality of n-type semiconductor layers 31 are juxtaposed in the first direction beside the other short side. Each pair of n⁻-type semiconductor layer 30 and n-type semiconductor layer 31 constitutes a second charge transfer portion 9. Each n⁻-type semiconductor layer 30 is arranged so as to contact one side intersecting with the second direction out of the sides of the corresponding n-type semiconductor layer 29. Each second charge transfer portion 9 is arranged beside one side intersecting with the second direction out of the sides of the corresponding second charge accumulation region A2. As in the case of the n-type semiconductor layers 22, each one of the p⁺-type semiconductor layers 35 is arranged between a set of adjacent n⁻-type semiconductor layers 30 and between a set of adjacent n-type semiconductor layers 31 to constitute an isolation region between the second charge transfer portions 9.

An electrode 45 is arranged above each n⁻-type semiconductor layer 30 and each n-type semiconductor layer 31. The electrode 45 is formed on each n⁻-type semiconductor layer 30 and each n-type semiconductor layer 31 through an insulating layer (not shown). The electrode 45 extends in the first direction and is formed across each n⁻-type semiconductor layer 30 and each n-type semiconductor layer 31. The electrode 45 may be formed per the n⁻-type semiconductor layer 30 and per the n-type semiconductor layer 31. The electrode 45 is given the signal TG to drive the second charge transfer portions 9.

Each one of the n⁻-type semiconductor layers 32 is arranged per n-type semiconductor layer 31. Each n⁻-type semiconductor layer 32 is adjacent in the second direction to the corresponding n-type semiconductor layer 31. Namely, the plurality of n⁻-type semiconductor layers 32 are juxtaposed in the first direction beside the other short side. Each one of the n-type semiconductor layers 33 is arranged per n⁻-type semiconductor layer 32. Each n-type semiconductor layer 33 is adjacent in the second direction to the n⁻-type semiconductor layer 32. Namely, the plurality of n-type semiconductor layers 33 are juxtaposed in the first direction beside the other short side. The adjacent n⁻-type semiconductor layers 32 and adjacent n-type semiconductor layers 33 are in contact with each other. The plurality of n⁻-type semiconductor layers 32 and the plurality of n-type semiconductor layers 33 constitute the second shift register 11.

An electrode 46 is arranged above each pair of n⁻-type semiconductor layer 32 and n-type semiconductor layer 33. The electrode 46 is formed on each pair of n⁻-type semiconductor layer 32 and n-type semiconductor layer 33 through an insulating layer (not shown). The electrode 46 is formed per pair of n-type semiconductor layer 32 and n-type semiconductor layer 33. The electrodes 46 are given the signal PG to drive the second shift register 11.

The p⁺-type semiconductor layer 28 is adjacent in the second direction to the n-type semiconductor layers 27. The p⁺-type semiconductor layer 34 is adjacent in the second direction to the n-type semiconductor layers 33. The p⁺-type semiconductor layers 28, 34 electrically separate the plurality of n-type semiconductor layers 22, 23, 25, 27, 29, 31, 33 and the plurality of n⁻-type semiconductor layers 24, 26, 30, 32 from the other part of the semiconductor substrate 20.

As shown in FIG. 4, each one of the n³¹-type semiconductor layers 36 is arranged per n-type semiconductor layer 23. Each n⁻-type semiconductor layer 36 is adjacent in the first direction to the corresponding n-type semiconductor layer 23. Each one of the n⁺-type semiconductor layers 37 is arranged per n⁻-type semiconductor layer 36. Each n⁺-type semiconductor layer 37 is adjacent in the first direction to the corresponding n⁻-type semiconductor layer 36. Namely, the plurality of n⁻-type semiconductor layers 36 and n⁺-type semiconductor layers 37 are juxtaposed in the first direction as alternated with the plurality of n-type semiconductor layers 23. Each pair of n⁻-type semiconductor layer 36 and n⁺-type semiconductor layer 37 constitutes a first charge drain portion 6. Each n⁻-type semiconductor layer 36 is arranged so as to contact one side along the second direction out of the sides of the corresponding n-type semiconductor layer 23. Each first charge drain portion 6 is arranged beside one side along the second direction out of the sides of the corresponding first charge accumulation region A1.

An electrode 47 is arranged above each n⁻-type semiconductor layer 36. The electrode 47 is formed on each n⁻-type semiconductor layer 36 through an insulating layer (not shown). The electrode 47 is formed per n⁻-type semiconductor layer 36. Each n⁺-type semiconductor layer 37 is connected to the control circuit (not shown) and charges transferred to the respective n⁺-type semiconductor layers 37 are drained to the control circuit. The electrodes 47 are given a signal RG to drive the first charge drain portions 6.

Each one of the n⁻-type semiconductor layers 38 is arranged per n-type semiconductor layer 29. Each n⁻-type semiconductor layer 38 is adjacent in the first direction to the corresponding n-type semiconductor layer 29. Each one of the n⁺-type semiconductor layers 39 is arranged per n⁻-type semiconductor layer 38. Each n⁺-type semiconductor layer 39 is adjacent in the first direction to the corresponding n⁻-type semiconductor layer 38. Namely, the plurality of n⁻-type semiconductor layers 38 and n⁺-type semiconductor layers 39 are juxtaposed in the first direction as alternated with the plurality of n-type semiconductor layers 29. Each pair of n⁻-type semiconductor layer 38 and n⁺-type semiconductor layer 39 constitutes a second charge drain portion 10. Each n⁻-type semiconductor layer 38 is arranged so as to contact one side along the second direction out of the sides of the corresponding n-type semiconductor layer 29. Each second charge drain portion 10 is arranged beside one side along the second direction out of the sides of the corresponding second charge accumulation region A2.

An electrode 48 is arranged above each n⁻-type semiconductor layer 38. The electrode 48 is formed on each n⁻-type semiconductor layer 38 through an insulating layer (not shown). The electrode 48 is formed per n⁻-type semiconductor layer 38. Each n⁺-type semiconductor layer 39 is connected to the control circuit (not shown) and charges transferred to the respective n⁺-type semiconductor layers 39 are drained to the control circuit. The electrodes 48 are given the signal RG to drive the second charge drain portions 10.

Each of the above-described insulating layers is comprised, for example, of a silicon oxide film. A light shield member may be arranged for shield of light on the part of the p-type semiconductor layer 21 other than the part forming the pn junctions with the n-type semiconductor layers 22. In this case, generation of unnecessary charge is prevented. A light shield member may be arranged for shield of light on the plurality of n-type semiconductor layers 22, 23, 25, 27, 29, 31, 33 and on the plurality of n⁻-type semiconductor layers 24, 26, 30, 32. In this case, generation of unnecessary charge is further prevented.

Figure 5:
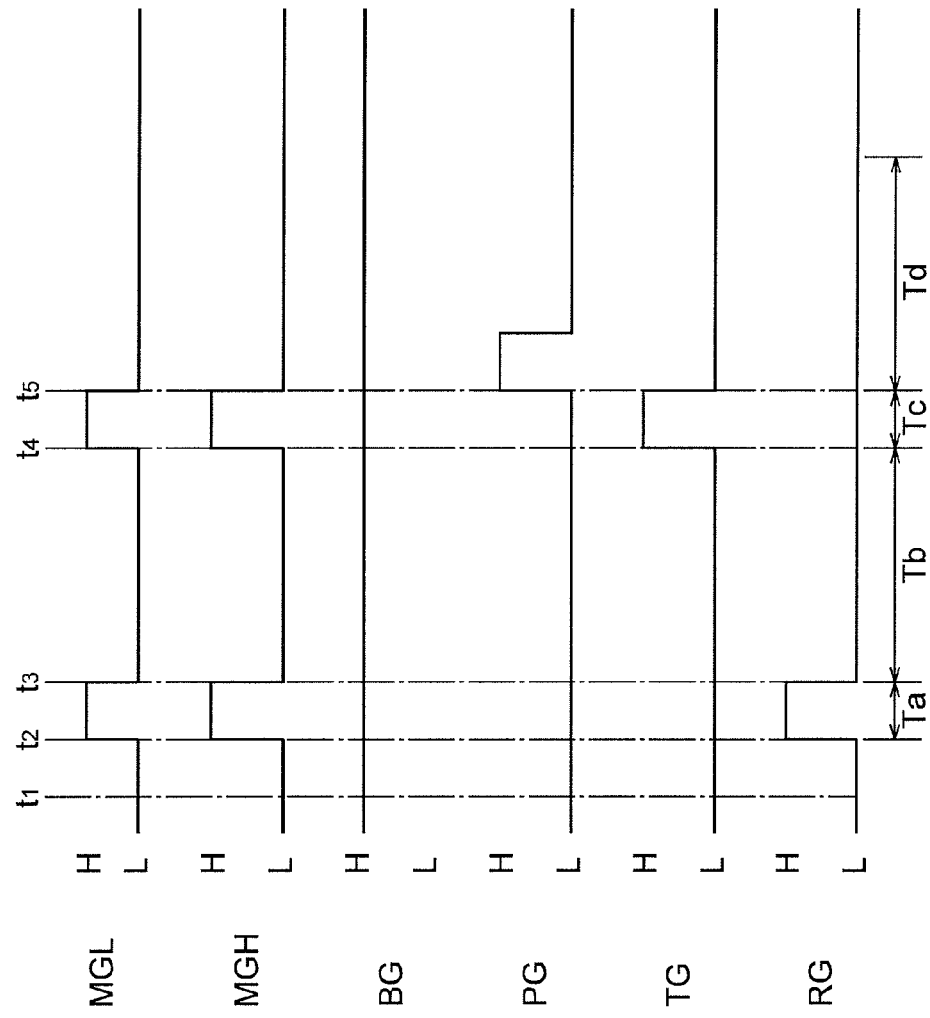
FIG. 5 is a timing chart of signals supplied in the solid state imaging device according to the embodiment.
Figure 6:
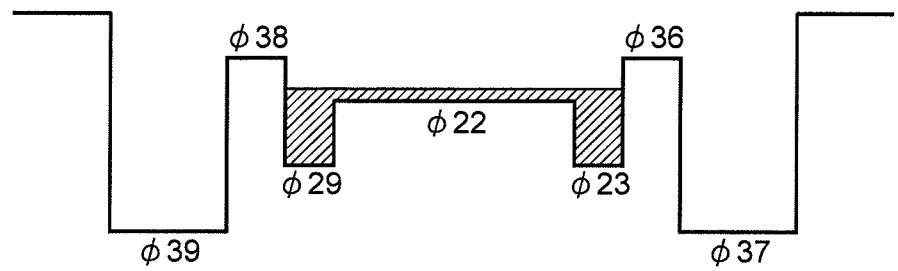
FIG. 6 is potential diagrams for explaining a charge drain operation.
Figure 6:
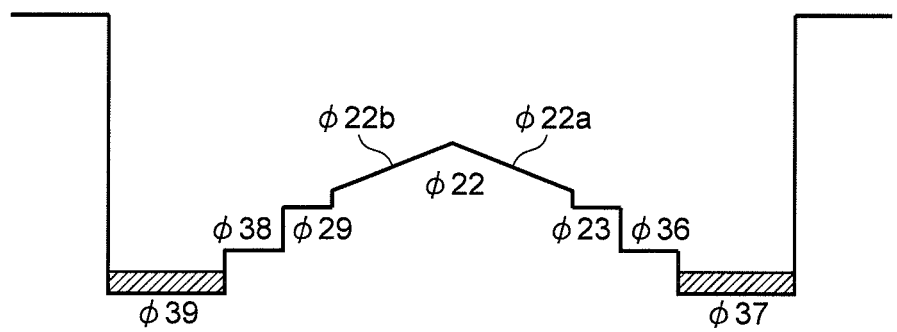
Figure 6:
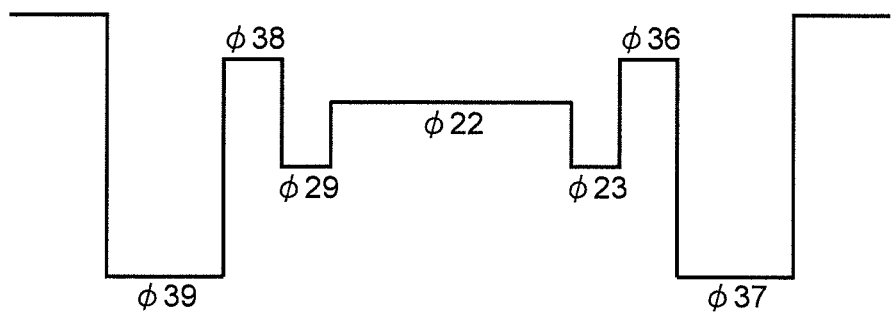
Figure 7:
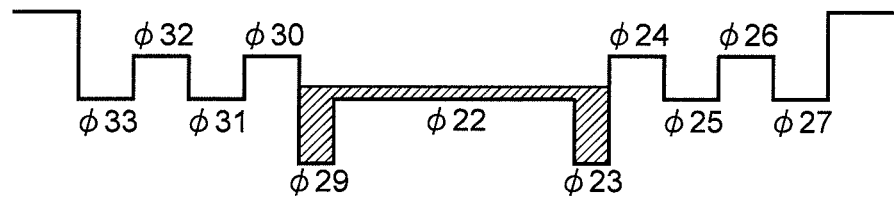
FIG. 7 is potential diagrams for explaining a charge readout operation.
Figure 7:
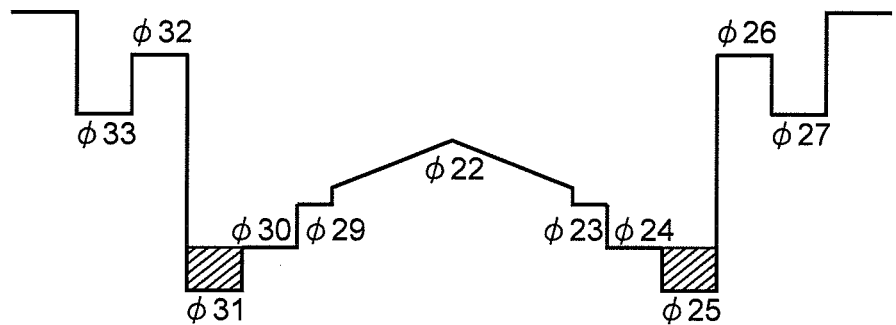
Figure 7:
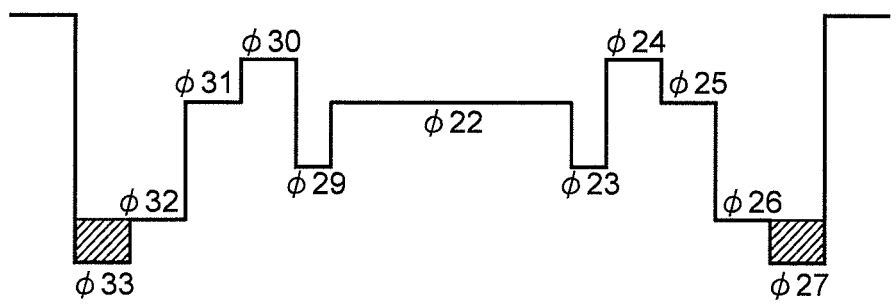

Next, operations in the solid state imaging device 1 will be described based on FIGS. 5 to 7. FIG. 5 is a timing chart of signals supplied in the solid state imaging device according to the present embodiment. FIG. 6 is potential diagrams for explaining a charge drain operation. FIG. 7 is potential diagrams for explaining a charge readout operation.

Incidentally, positively ionized donors exist in an n-type semiconductor, whereas negatively ionized acceptors exist in a p-type semiconductor. At a pn junction, a potential in n-type is higher than a potential in p-type. In other words, the positive direction for potentials in energy band diagrams is downward and therefore a potential in an n-type semiconductor is deeper (or higher) than a potential in a p-type semiconductor in energy band diagrams. When a positive potential is applied to each electrode 15a, 15b, 16, 41-48, a potential in a semiconductor region immediately below the electrode becomes deeper (or larger in the positive direction). As the magnitude of the positive potential applied to each electrode decreases, the potential of the semiconductor immediately below the corresponding electrode becomes shallower (or smaller in the positive direction).

Time t3 shown in FIG. 5 is a start time of a period as a target of photodetection and time t5 an end time of the period as a target of photodetection. The first step in photodetection is to drain charges generated before the start time of the period as the target of photodetection, as unnecessary charges. The next step is to accumulate charges generated up to the end time of the period as the target of photodetection, as signal charges. Then the signal charges accumulated are read out. The readout of signal charges is carried out by the charge transfer portions 5, 9 and in the present embodiment the accumulation and readout of signal charges are carried out simultaneously. In the present embodiment, a duration from time t2 to time t3 is set as a charge drain period Ta to drain the unnecessary charges, a duration from time t3 to time t4 as a charge accumulation period Tb to accumulate the signal charges, a duration from time t4 to time t5 as a charge readout period Tc to simultaneously perform the accumulation and readout of signal charges, and a predetermined duration after the time t5 as a charge readout period Td to the outside. The charge drain period Ta is set to a length enough to drain all the accumulated charges before the time t3.

At time t1 before time t2, when each of the signals MGL, MGH, TG and PG is at L-level and the signal BG at H-level, a potential $\phi 22$ of the n-type semiconductor layers 22 becomes deeper than potentials $\phi 24$, $\phi 30$ of the n⁻-type semiconductor layers 24, 30 and potentials $\phi 36$, $\phi 38$ of the n⁻-type semiconductor layers 36, 38 (cf. FIG. 6(a)). Potentials $\phi 23$, $\phi 29$ of the n-type semiconductor layers 23, 29 become much deeper than the potential $\phi 22$ (cf. FIG. 7(a)). This process results in forming wells of potentials $\phi 22$, $\phi 23$, and $\phi 29$. Charges generated with incidence of light to the photosensitive regions 13 are accumulated in the wells of potentials $\phi 22$, $\phi 23$, $\phi 29$. Namely, the charges generated in the photosensitive regions 13 are accumulated in the photosensitive regions 13, first charge accumulation portions 4, and second charge accumulation portions 8.

At time t2, when each of the signals MGL, MGH is changed from L-level to H-level, the potential gradient along the second direction is formed. According to the potential gradient, the potential $\phi 22$ is formed so as to have a potential gradient $\phi 22a$ becoming deeper toward the potential $\phi 23$ and a potential gradient $\phi 22b$ becoming deeper toward the potential $\phi 29$ (cf. FIG. 6(b)). The charges accumulated in the well of potential $\phi 22$ are moved into a well of potential $\phi 23$ by the potential gradient $\phi 22a$ and into a well of $\phi 29$ by the potential gradient $\phi 22b$. Namely, the charges accumulated in the photosensitive regions 13 are transferred from the photosensitive regions 13 to be accumulated in the first charge accumulation portions 4 and the second charge accumulation portions 8.

At the same time t2, when the signal RG is changed from L-level to H-level, potentials $\phi 36$, $\phi 38$ of the n⁻-type semiconductor layers 36, 38 become deeper than the potentials $\phi 23$, $\phi 29$. Potentials $\phi 37$, $\phi 39$ of the n⁺-type semiconductor layers 37, 39 are much deeper than the potentials $\phi 36$, $\phi 38$, to form wells of potentials $\phi 37$, $\phi 39$. The charges accumulated in the well of potential $\phi 23$ are moved into the well of potential $\phi 37$. The charges accumulated in the well of potential $\phi 29$ are moved into the well of potential $\phi 39$. The charges moved into the wells of potentials $\phi 37$, $\phi 39$ are drained to the control circuit (not shown). Namely, the charges transferred from the first charge accumulation portions 4 are drained as unnecessary charges by the first charge drain portions 6 and the charges transferred from the second charge accumulation portions 8 are drained as unnecessary charges by the second charge drain portions 10 (cf. FIG. 6(b)). The time when the signals MGH, RG are changed from L-level to H-level may be set at a point earlier than the time t2.

At time t3, when each of the signals MGL, MGH is changed from H-level to L-level and the signal RG from H-level to L-level, the potentials $\phi22$, $\phi36$, $\phi38$ return to the respective depths at time t1 to move into a state in which charges can be accumulated in the wells of potentials $\phi22$, $\phi23$, $\phi29$ (cf. FIG. 6(c)). Charges generated in the photosensitive regions 13 during the charge accumulation period Tb are accumulated in the wells of potentials $\phi22$, $\phi23$, $\phi29$. Namely, the charges generated in the photosensitive regions 13 in the charge accumulation period Tb are accumulated in the photosensitive regions 13, first charge accumulation portions 4, and second charge accumulation portions 8 (cf. FIG. 7(a)).

At time t4, when each of the signals MGL, MGH is changed from L-level to H-level, the same potential gradients $\phi22a$, $\phi22b$ as at the time t2 are established (cf. FIG. 7(b)). The charges accumulated in the well of potential $\phi22$ in the charge accumulation period Tb are moved into the well of potential $\phi23$ by the potential gradient $\phi22a$ and into the well of potential $\phi29$ by the potential gradient $\phi22b$. Namely, the charges accumulated in the photosensitive regions 13 in the charge accumulation period Tb are transferred from the photosensitive regions 13 to be accumulated in the first charge accumulation portions 4 and the second charge accumulation portions 8.

At the same time t4, when the signal TG is changed from L-level to H-level, the potentials $\phi24$, $\phi30$ of the n⁻-type semiconductor layers 24, 30 become deeper than the potentials $\phi23$, $\phi29$. The potentials $\phi25$, $\phi31$ of the n-type semiconductor layers 25, 31 become much deeper than the potentials $\phi24$, $\phi30$. This process results in forming wells of potentials $\phi24$, $\phi25$ and wells of potentials $\phi30$, $\phi31$. The charges accumulated in the well of potential $\phi23$ are moved into the well of potential $\phi25$. The charges accumulated in the well of potential $\phi29$ are moved into the well of potential $\phi31$. Namely, the charges transferred from the first charge accumulation portions 4 are acquired as signal charges by the first charge transfer portions 5 and the charges transferred from the second charge accumulation portions 8 are acquired as signal charges by the second charge transfer portions 9 (cf. FIG. 7(b)). The time when each of the signals MGL, MGH, TG is changed from L-level to H-level may be set at a point later than the time t4.

At time t5, when each of the signals MGL, MGH, TG is changed from H-level to L-level and PG is changed from L-level to H-level, the potentials $\phi26$, $\phi32$ of the n⁻-type semiconductor layers 26, 32 become deeper than the potentials $\phi25$, $\phi31$. The potentials $\phi27$, $\phi33$ of the n-type semiconductor layers 27, 33 become much deeper than the potentials $\phi26$, $\phi32$. This process results in forming wells of potentials $\phi26$, $\phi27$ and wells of $\phi32$, $\phi33$. The charges accumulated in the well of potential $\phi25$ are moved into the well of potential $\phi27$. The charges accumulated in the well of potential $\phi31$ are moved into the well of potential $\phi33$. Namely, the charges transferred from the first charge transfer portions 5 are acquired by the first shift register 7 and the charges transferred from the second charge transfer portions 9 are acquired by the second shift register 11 (cf. FIG. 7(C)).

After this, the charges acquired by the first shift register 7 and the second shift register 11 are transferred in the first direction to be sequentially output to the adding portion 12. The adding portion 12 adds the charge output from the second shift register 11 to the charge output from the first shift register 7, and outputs the resulting charge to the amplifier portion 17. The charge transfer in the first direction in the first shift register 7 and the second shift register 11 is carried out using the signal PG and others, which is omitted from the illustration in FIG. 5.

In the present embodiment, as described above, the photosensitive region 13 has a relatively large area because the planar shape thereof is the shape extending along the long sides. This configuration enhances the sensitivity of the solid state imaging device 1 to incident light.

In the charge drain period Ta, the first potential gradient forming region 3a (potential gradient forming portion 3) forms the potential gradient becoming lower from the electrode 15a to the electrode 16 (along the second direction) and the second potential gradient forming region 3b (potential gradient forming portion 3) forms the potential gradient becoming higher from the electrode 16 to the electrode 15b (along the second direction). The charges generated in the regions corresponding to the first potential gradient forming region 3a in the photosensitive regions 13 are transferred to the one short side by the potential gradient becoming lower from the electrode 15a to the electrode 16. The charges transferred to the one short side of the photosensitive region 13 are drained as unnecessary charge by the first charge drain portion 6. The charges generated in the regions corresponding to the second potential gradient forming region 3b in the photosensitive regions 13 are transferred to the other short side by the potential gradient becoming higher from the electrode 16 to the electrode 15b. The charges transferred to the other short side of the photosensitive regions 13 are also drained as unnecessary charges by the second charge drain portions 10. Since the charges generated in the photosensitive regions 13 are transferred respectively to the one short side and to the other short side as described above, the period of charge drain becomes shorter in the process of draining the charges generated in the photosensitive regions 13, as unnecessary charges. Therefore, it becomes feasible to set the charge drain period Ta shorter and the charge accumulation period Tb longer.

In the charge readout period Tc, the first potential gradient forming region 3a forms the potential gradient becoming lower from the electrode 15a to the electrode 16 (along the second direction) and the second potential gradient forming region 3b forms the potential gradient becoming higher from the electrode 16 to the electrode 15b (along the second direction). The charges generated in the regions corresponding to the first potential gradient forming region 3a in the photosensitive regions 13 are transferred to the one short side by the potential gradient becoming lower from the electrode 15a to the electrode 16, and thereafter are transferred in the first direction by the first shift register 7. The charges generated in the regions corresponding to the second potential gradient forming region 3b in the photosensitive regions 13 are transferred to the other short side by the potential gradient becoming higher from the electrode 16 to the electrode 15b and thereafter are transferred in the first direction by the second shift register 11. Since the charges generated in the photosensitive region 13 are transferred respectively to the one short side and to the other short side, the period of readout becomes shorter in the process of reading the charges generated in the photosensitive region 13, as signal charges. Therefore, it becomes feasible to set the charge readout period Tc shorter.

In the charge readout period Td to the outside, the transfer of charges in the first direction is carried out by the aforementioned first shift register 7 and second shift register 11.

The first charge drain portion 6 and the second charge drain portion 10 are arranged corresponding to each photosensitive region 13. This configuration shortens the period for drain of charges from the respective photosensitive regions 13.

The solid state imaging device 1 is provided with the adding portion 12 for adding the charge output from the second shift register 11 to the charge output from the first shift register 7. This configuration eliminates a need for an addition process outside the solid state imaging device 1.

The solid state imaging device 1 is provided with the first charge accumulation portions 4 and the second charge accumulation portions 8. The first shift register 7 transfers and outputs the charges transferred from the first charge accumulation portions 4, in the first direction, and the first charge drain portions 6 drain the charges transferred from the first charge accumulation portions 4. The second shift register 11 transfers and outputs the charges transferred from the second charge accumulation portions 8, in the first direction, and the second charge drain portions 10 drain the charges transferred from the second charge accumulation portions 8. For this reason, there is no need for arranging the first shift register 7, the first charge drain portions 6, the second shift register 11, and the second charge drain portions 10 next to the photosensitive regions 13 in the solid state imaging device 1, which provides higher degrees of freedom for arrangement of each portion.

The first shift register 7, the first charge transfer portions 5, and the first charge accumulation portions 4 are juxtaposed in the second direction. The first charge drain portions 6 and the first charge accumulation portions 4 are juxtaposed in the first direction. The direction of charge transfer (charge readout) from the first charge accumulation portions 4 to the first shift register 7 and the direction of charge transfer (charge drain) from the first charge accumulation portions 4 to the first charge drain portions 6 intersect with each other. Therefore, passages of charges transferred from the first charge accumulation portions 4 during the charge drain are formed in the direction in which there are no passages of charges transferred from the first charge accumulation portions 4 during the charge readout. This configuration forms larger passages of charges transferred from the first charge accumulation portions 4 during the charge drain, which makes the period for drain of charge shorter. Since the first shift register 7 and the first charge accumulation portions 4 are juxtaposed in the second direction, the first charge accumulation portions 4 do not impede the charge transfer in the first direction by the first shift register 7.

The second charge accumulation portions 8, the second charge transfer portions 9, and the second shift register 11 are juxtaposed in the second direction. The second charge drain portions 10 and the second charge accumulation portions 8 are juxtaposed in the first direction. For this reason, the direction of charge transfer (charge readout) from the second charge accumulation portions 8 to the second shift register 11 and the direction of charge transfer (charge drain) from the second charge accumulation portions 8 to the second charge drain portions 10 intersect with each other. Therefore, passages of charges transferred from the second charge accumulation portions 8 during the charge drain are formed in the direction in which there are no passages of charges transferred from the second charge accumulation portions 8 during the charge readout. This configuration forms larger passages of charges transferred from the second charge accumulation portions 8 during the charge drain, which makes the period for drain of charge shorter. Since the second shift register 11 and the second charge accumulation portions 8 are juxtaposed in the second direction, the second charge accumulation portions 8 do not impede the charge transfer in the first direction by second shift register 11.

The first charge accumulation region A1 is formed in the first charge accumulation portion 4. The first charge accumulation region A1 has the planar shape of the nearly rectangular shape composed of the two sides along the second direction and the two sides intersecting with the second direction. The first charge transfer portion 5 and the first shift register 7 are arranged beside the one side intersecting with the second direction out of the sides of the first charge accumulation region A1. The first charge drain portion 6 is arranged beside the one side along the second direction out of the sides of the first charge accumulation region A1. Therefore, the passages of charges transferred from the first charge accumulation portions 4 during the charge drain are formed in the direction in which there are no passages of charges transferred from the first charge accumulation portions 4 during the charge readout. This configuration forms larger passages of charges transferred from the first charge accumulation portions 4 during the charge drain, which makes the period for drain of charge shorter.

The second charge accumulation region A2 is formed in the second charge accumulation portion 8. The second charge accumulation region A2 has the planar shape of the nearly rectangular shape composed of the two sides along the second direction and the two sides intersecting with the second direction. The second charge transfer portion 9 and the second shift register 11 are arranged beside the one side intersecting with the second direction out of the sides of the second charge accumulation region A2. The second charge drain portion 10 is arranged beside the one side along the second direction out of the sides of the second charge accumulation region A2. Therefore, the passages of charges transferred from the second charge accumulation portions 8 during the charge drain are formed in the direction in which there are no passages of charges transferred from the second charge accumulation portions 8 during the charge readout. This configuration forms larger passages of charges transferred from the second charge accumulation portions 8 during the charge drain, which makes the period for drain of charge shorter.

Since the potential gradient forming portion 3 has the electroconductive member 14 and the electrodes 15a, 15b, 16, the potential gradient is formed by the simple configuration of the electroconductive member and the electrodes.

The solid state imaging device 1 is the back illuminated type, in which light is incident into the photosensitive regions 13 from the p-type semiconductor layer 21 side. The electroconductive member 14 and the electrodes 15a, 15b, 16 are not formed on the p-type semiconductor layer 21. For this reason, the electroconductive member 14 and the electrodes 15a, 15b, 16 do not block the incident light.

The above described the preferred embodiment of the present invention, and it should be noted that the present invention is by no means limited to the above embodiment and can be modified in many ways without departing from the spirit and scope of the invention.

The present embodiment showed the example wherein the first charge drain portion 6 and the second charge drain portion 10 were arranged corresponding to each photosensitive region 13, but the present invention is not limited to this configuration. For example, as shown in FIG. 8, the first charge drain portion 6 and the second charge drain portion 10 may be arranged corresponding to each pair of two photosensitive regions 13 adjacent in the first direction.

Figure 8:
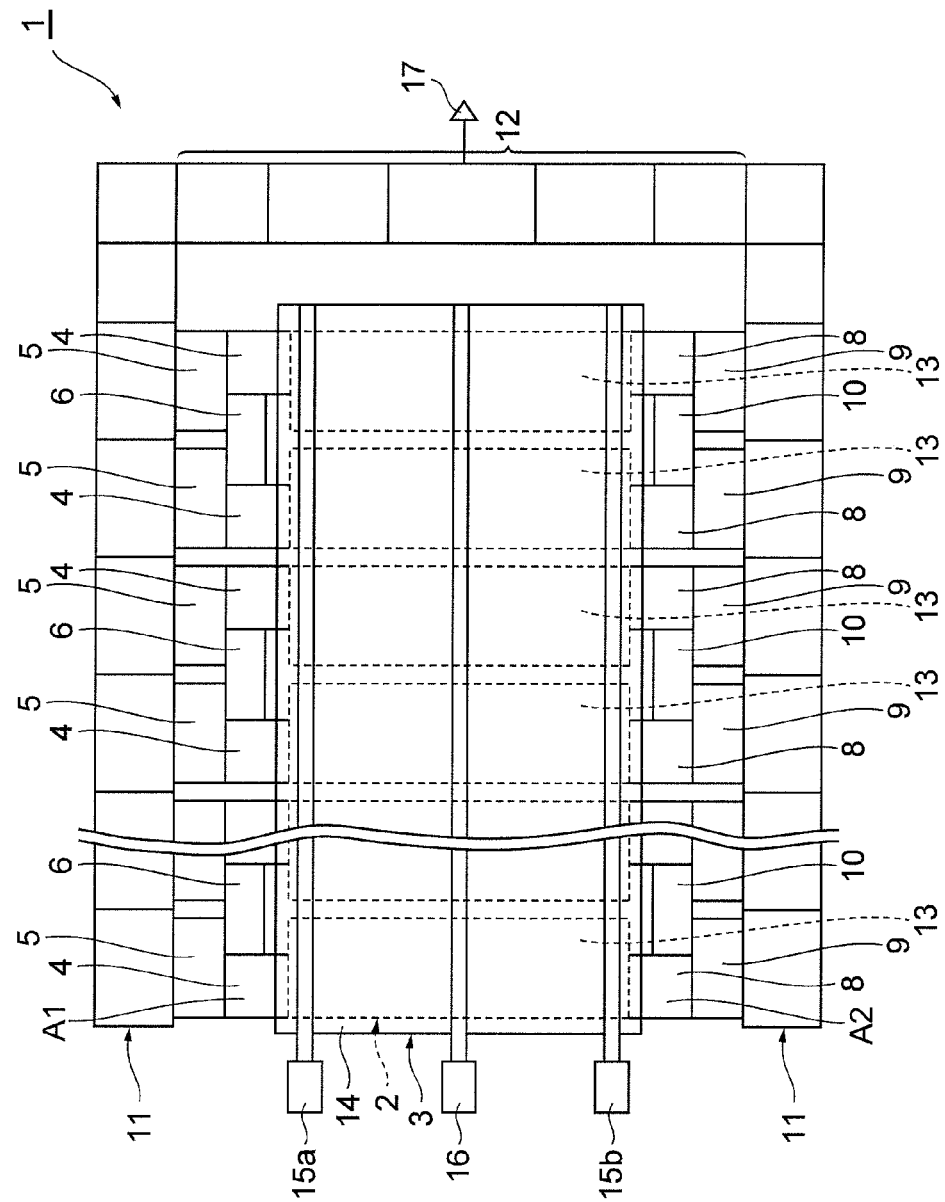
FIG. 8 is a plan view showing a modification of the solid state imaging device according to the embodiment.

The plurality of first charge drain portions 6 shown in FIG. 8 are arranged each corresponding to two adjacent first charge accumulation portions 4. Each one of the first charge drain portions 6 is arranged adjacent to the corresponding two first charge accumulation portions 4. Each first charge drain portion 6 drains charges transferred from the corresponding two first charge accumulation portions 4. The plurality of second charge drain portions 10 are arranged each corresponding to two adjacent second charge accumulation portions 8. Each second charge drain portion 10 is arranged adjacent to the corresponding two second charge accumulation portions 8. Each second charge drain portion 10 drains charges transferred from the corresponding two second charge accumulation portions 8.

In the solid state imaging device 1 shown in FIG. 8, when compared to the solid state imaging device 1 shown in FIG. 1, the numbers of first charge drain portions 6 and second charge drain portions 10 are smaller and each of the first charge drain portions 6 and second charge drain portions 10 can be formed in a larger area. Therefore, the first charge drain portions 6 and the second charge drain portions 10 can be readily formed.

Figure 9:
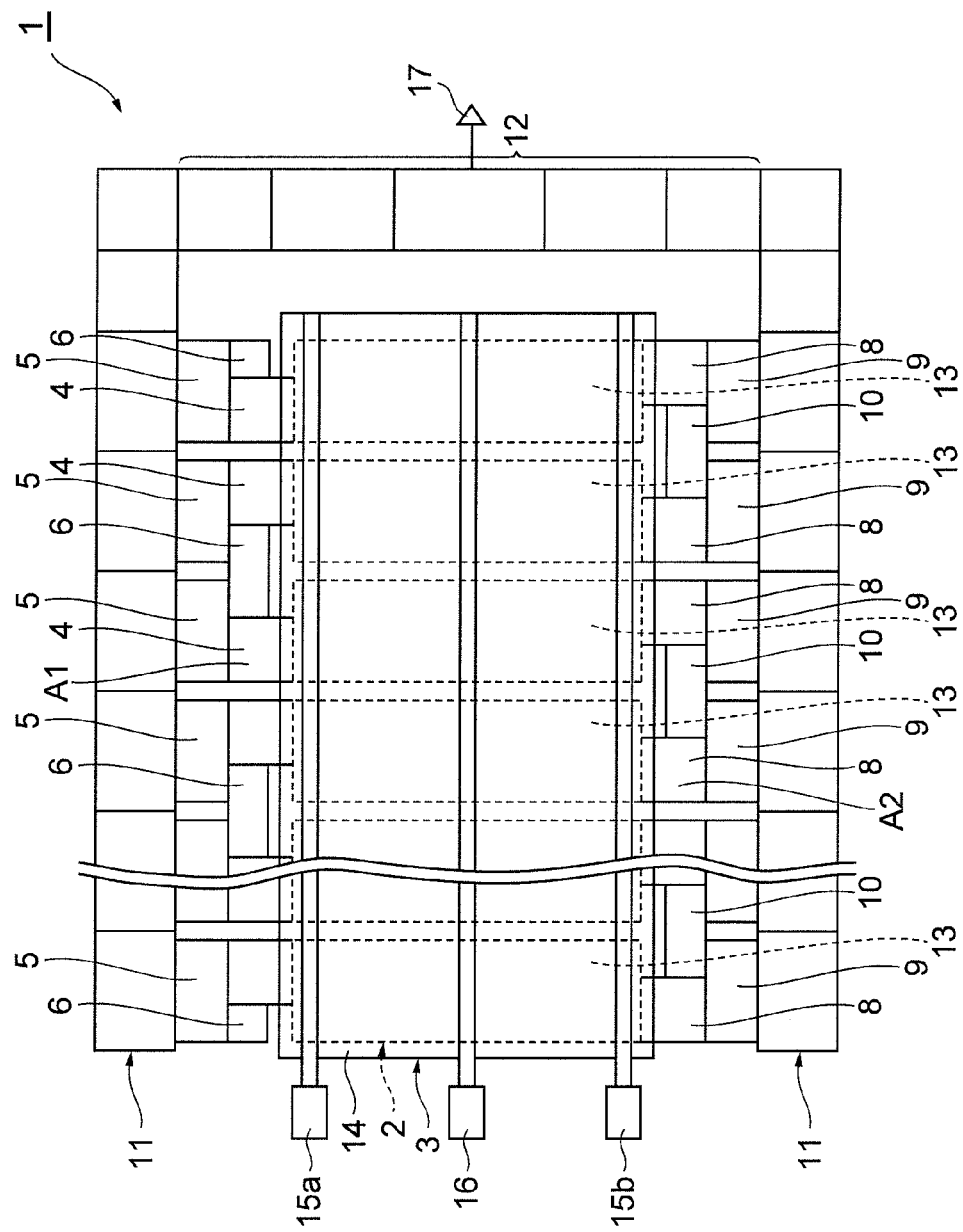
FIG. 9 is a plan view showing another modification of the solid state imaging device according to the embodiment.

Furthermore, as shown in FIG. 9, the first charge drain portions 6 and the second charge drain portions 10 may be alternated along the first direction.

In each of the first charge drain portions 6 and the second charge drain portions 10 shown in FIGS. 8 and 9, there are cases where a drain speed of a charge transferred from one side of the corresponding two photosensitive regions 13 is different from that of a charge transferred from the other side. Even in such cases, each photosensitive region 13 shown in FIG. 9 transfers the charge from the one side to one of the first charge drain portion 6 and the second charge drain portion 10, and from the other side to the other of the first charge drain portion 6 and the second charge drain portion 10. For this reason, the difference of charge drain periods in each photosensitive region 13 is reduced in the solid state imaging device 1 shown in FIG. 9, when compared to the solid state imaging device 1 shown in FIG. 8.

The electroconductive member 14 and the electrodes 15a, 15b, extend in the first direction and are formed across each photosensitive region 7, but they may be formed as divided into a plurality of segments.

The photosensitive regions 13 are juxtaposed in the one-dimensional direction along the short sides, but they may also be juxtaposed in the direction along the long sides so as to be arranged in two-dimensional directions along the short-side direction and the long-side direction.

The solid state imaging device 1 is the back illuminated type in which light is incident from the p-type semiconductor layer 21 side, but the present invention is not limited to this type. The solid state imaging device 1 may be a front illuminated type in which light is incident from the n-type semiconductor layer 22 side.

Industrial Applicability

The present invention is applicable to the photodetection means of spectroscope.

List of Reference Signs 1 solid state imaging device; 2 photoelectric conversion portion; 3 potential gradient forming portion; 3a first potential gradient forming region; 3b second potential gradient forming region; 4 first charge accumulation portion; 6 first charge drain portion; 7 first shift register; 8 second charge accumulation portion; 10 second charge drain portion; 11 second shift register; 12 adding portion; 13 photosensitive region; 14 electroconductive member; 15a, 15b, 16 electrodes.

The invention claimed is:

1. A solid state imaging device comprising:
a photoelectric conversion portion having a plurality of photosensitive regions which generate respective charges according to incidence of light and a planar shape of each of which is a substantially rectangular shape composed of two long sides and two short sides, the photosensitive regions being juxtaposed in a first direction intersecting with the long sides;
a potential gradient forming portion which is arranged opposite to the plurality of photosensitive regions and which forms a potential gradient along a second direction from one of the short sides to the other of the short sides;
a first charge output portion which is arranged beside the one short side and which transfers charges transferred from the respective photosensitive regions, in the first direction and outputs the charges;
a second charge output portion which is arranged beside the other short side and which transfers charges transferred from the respective photosensitive regions, in the first direction and outputs the charges;
a first charge drain portion which is arranged beside the one short side and which drains charges transferred from the respective photosensitive regions; and
a second charge drain portion which is arranged beside the other short side and which drains charges transferred from the respective photosensitive regions,
wherein the potential gradient forming portion has a first potential gradient forming region to form a potential gradient becoming lower along the second direction, and a second potential gradient forming region to form a potential gradient becoming higher along the second direction, the second potential gradient forming region being arranged next to the first potential gradient forming region in the second direction.

2. The solid state imaging device according to claim 1, wherein the first charge drain portion and the second charge drain portion are arranged corresponding to each one of the photosensitive regions.

3. The solid state imaging device according to claim 1, wherein the first charge drain portion and the second charge drain portion are arranged corresponding to each set of two said photosensitive regions adjacent in the first direction.

4. The solid state imaging device according to claim 3, wherein the first charge drain portions and the second charge drain portions are alternated along the first direction.

5. The solid state imaging device according to claim 1, further comprising:
an adding portion which adds the charge output from the second charge output portion to the charge output from the first charge output portion.

6. The solid state imaging device according to claim 1, further comprising:
a first charge accumulation portion which is arranged beside the one short side and which accumulates charges transferred from the respective photosensitive regions; and
a second charge accumulation portion which is arranged beside the other short side and which accumulates charges transferred from the respective photosensitive regions,
wherein the first charge output portion transfers charges transferred from the first charge accumulation portion, in the first direction and outputs the charges, and the first charge drain portion drains charges transferred from the first charge accumulation portion, and wherein the second charge output portion transfers charges transferred from the second charge accumulation portion, in the first direction and outputs the charges, and the second charge drain portion drains charges transferred from the second charge accumulation portion.

7. The solid state imaging device according to claim 1, wherein the potential gradient forming portion has an electroconductive member arranged opposite to the plurality of photosensitive regions, a pair of electrodes connected to two end areas in the second direction of the electroconductive member, and an electrode connected to the electroconductive member between the two end areas.

8. The solid state imaging device according to claim 1, said solid state imaging device being a back illuminated type.

* * * * *